United States Patent [19]

Harazaki

[11] Patent Number: 5,441,835
[45] Date of Patent: Aug. 15, 1995

[54] PHOTOMASK AND PROJECTION EXPOSURE MECHANISM USING THE SAME

[75] Inventor: Katsuhiko Harazaki, Tenri, Japan

[73] Assignee: Sharp Kabushiki Kaisha, Osaka, Japan

[21] Appl. No.: 137,802

[22] Filed: Oct. 18, 1993

Related U.S. Application Data

[63] Continuation of Ser. No. 856,994, Mar. 24, 1992.

[30] Foreign Application Priority Data

Mar. 27, 1991 [JP] Japan .................................. 3-063321

[51] Int. Cl.[6] .............................................. G03F 9/00
[52] U.S. Cl. ........................................ 430/5; 430/311; 430/321; 430/396
[58] Field of Search ................... 430/5, 311, 321, 322, 430/396

[56] References Cited

U.S. PATENT DOCUMENTS 4,952,026  8/1990  Bellman et al. ..................... 430/322
5,079,112  1/1992  Berger et al. ........................... 430/5

FOREIGN PATENT DOCUMENTS 56-168654  12/1981  Japan .
320733    1/1991   Japan .

OTHER PUBLICATIONS

"Phase-Shifting Technology Dig." (1991) pp. 58–61.
"Tech. Dig. Int. Electron Device Meeting" (1990) pp. 817–820.

Primary Examiner—S. Rosasco

[57] ABSTRACT

A photomask for receiving light for exposure from a light source and projecting the emitted light onto a resist film on a wafer through an optical system so as to pattern the resist film includes a plurality of light transmitting portions for transmitting the light for exposure through a converging portion, and a convex portion made of a transparent or translucent material. The convex portion is formed protruding into the side on which the wafer is provided in order to cover the light transmitting portions so that the light for exposure is emitted as transmitted light which can form an image on the imaging plane of the wafer by utilizing refractive effects.

13 Claims, 18 Drawing Sheets

Light intercepting portion | Light transmitting portion | Light intercepting portion

PHOTOMASK AND PROJECTION EXPOSURE MECHANISM USING THE SAME

This is a continuation application under 37 CRF 1.62 of prior application Ser. No. 07/856,994, filed on Mar. 24, 1992.

BACKGROUND OF THE INVENTION

1. Field of the Invention

The present invention relates to a photomask (reticle) to be used in a photolithography system, and more particularly to a photomask suited to efficiently transfer various fine patterns into different positions on a wafer.

2. Description of the Related Art

The photolithography technology of a reduced projection exposure method has approached the resolution limit with the reduction of design dimensions and the fineness of processing patterns. There has been used a phase shifting method for improving the resolution limit. According to the phase shifting method, the resolution limit is theoretically improved by about twice the resolution limit as compared with a conventional method. The phase shifting method has been described in IEEE Trans. on Electron Devices, Vol. ED-31, No. 6, 1984, pp. 753 to 763, for example (see FIG. 31).

However, the phase shifting method has the following drawbacks. That is, the phase shifting method is difficult to apply to a complex fine pattern such as an actual LSI pattern. More specifically, the phase shifting method is easy to apply to a regular line and space pattern. However, the phase shifting method is hard to apply to an isolated fine pattern, an aperiodic pattern, a plurality of combined patterns and the like.

For the plurality of combined patterns, there has been proposed a multistage phase shifting method described in Extended Abstracts of 51th Autumn Meeting of the Japan Society of Applied Physics (1990), pp. 491 and 492, Lecture No. 27p-ZG-4,5, for example. For the isolated pattern, there has been proposed an auxiliary pattern method disclosed in Japanese Unexamined Patent Publication No. 62(1987)-67514, for example. However, the above-mentioned methods are not easy to apply in practice.

There has also been known a phase shifting method in which a phase shifter 243 is provided only around a transmitting portion (see FIG. 30). This phase shifting method is a so-called self-aligning type (ex. edge enhancement, rim, etc.) and is effective in the resolution of the isolated pattern. In FIG. 30, a self-aligning type of phase shifting reticle sequentially includes a glass substrate 241 as a reticle and the phase shifter 243 from the light source side to the wafer side. The phase shifter 243 is provided through a Cr (chromium) film 242. A method using a self-aligning type phase shifter has been described in Extended Abstracts of 51th Autumn Meeting of the Japan Society of Applied Physics (1990), pp. 492, Lecture No. 27p-ZG-2, for example. Also in the self-aligning type of phase shifter, however, there is utilized the interference effects of light in a light transmitting portion. Consequently, the gradient of a light intensity is lowered, so that the self-aligning type of phase shifter is hard to apply to fine patterns.

When the processing patterns are made finer so as to have almost the same size as an exposure wavelength or less, a quantity of light transmitted through a reticle light transmitting portion is decreased. Consequently, the effects of oblique incident components cannot be ignored for vertical incident components (see FIG. 23). FIG. 24 shows the arrangement of an optical system. In FIG. 24, light emitted from a light source 221 passes through a condenser lens 222. The convergent light is incident on a photomask 21 within the range of an estimated angle $\theta c$ based on a focal position (for example, a central position represented by a point P2 of an aperture 141 as a light transmitting portion shown in FIG. 14). Then, the convergent light is emitted as transmitted light with an estimated angle $\theta p$ through a light transmitting portion 223, is projected onto the plane of a projection lens 224 in the direction of an optical axis (in the direction of an arrow A), and is finally projected onto the imaging plane of a wafer. FIG. 16 schematically shows an optical system. In FIG. 16, the reference numeral 225 denotes an imaging plane on the wafer. A waveform B denotes the light intensity of a projected image. In the case where the self-aligning type of waveform expands and the light intensity on the imaging plane is decreased. Consequently, a light intensity contrast (gradient) is lowered so that a resist pattern cannot be resolved. Since the phase difference between adjacent transmitted light is utilized, the phase shifting method is hard to apply to the isolated fine pattern, the aperiodic pattern and the plurality of combined patterns.

SUMMARY OF THE INVENTION

The present invention provides a photomask (reticle) wherein the above-mentioned drawbacks can be eliminated in fabricating an LSI pattern which appears in actual exposure steps.

More particularly, the present invention provides a photomask for receiving light for exposure from a light source and projecting the emitted light onto a resist film on a wafer through an optical system so as to pattern the resist film which comprises a plurality of light transmitting portions for transmitting the light for exposure through a converging portion, and a convex portion made of a transparent or translucent material and formed protruding into the side on which the wafer is provided in order to cover the light transmitting portions so that the light for exposure is emitted as transmitted light which can form an image on the imaging plane of the wafer by utilizing refractive effects.

In another aspect, the present invention provides a photomask for receiving light for exposure from a light source and projecting the emitted light onto a resist film on a wafer through an optical system so as to pattern the resist film which comprises a plurality of light transmitting portions through which incident light is transmitted, and a distributed refractive index lens provided in order to cover the light transmitting portions for emitting the incident light as transmitted light which can form an image on the imaging plane of the wafer by utilizing refractive effects.

The present invention provides as a mechanism having a photomask a projection exposure mechanism comprising a converging system for gathering light for exposure from a light source, a plurality of light transmitting portions through which incident light passing through the converging system is transmitted, a photomask including a convex portion or distributed refractive index lens which presents refractive effects for forming the incident light from the converging system as transmitted light which can form an image on the imaging plane of a wafer, an optical system for projecting the transmitted light from the photomask onto the wafer, and a supporting portion for supporting the wafer such that a wafer imaging plane is provided in parallel with a plane perpendicular to the optical axis of the light transmitted from the light source through the optical system.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS OF THE PRESENT INVENTION

According to an embodiment of the present invention, a convex portion (spherical or aspherical surface) is fabricated by using a material which transmits light to the center of a photomask light transmitting portion, and more propagation components of transmitted light are gathered on a projection lens (or an optical system) by utilizing the refractive effects of the light. Consequently, it is possible to improve a light intensity and a light intensity contrast on an imaging plane. More specifically, resolution is improved so that fine patterns can be transferred. Since the convex portion is a self-aligning type, it is easy to apply to an isolated pattern and an aperiodic pattern and it can be utilized for an actual LSI pattern.

The convex portion is provided on the center of the light transmitting portion and serves to gather on the projection lens (or optical system) more light propagation components in the vicinity of the transmitting portion by utilizing the refractive effects. More specifically, if the material and convex portion (having a curvature C or partial curvature Cp) of the transmitting portion are optimized for an optical system, the distribution of a light intensity of projected images can be improved.

Figure 23:
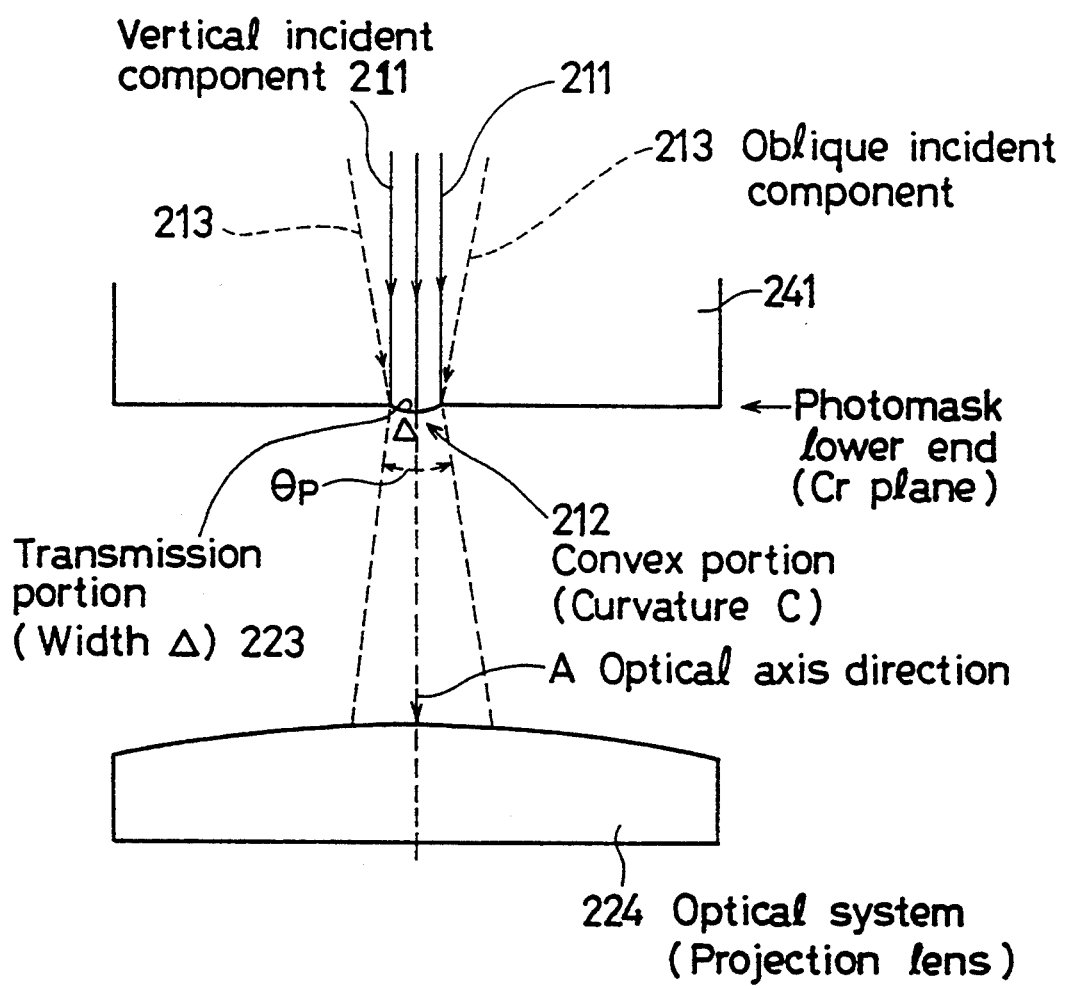
FIG. 23 is a view generally showing the propagation process of the transmitted light to be exposed.
Figure 24:
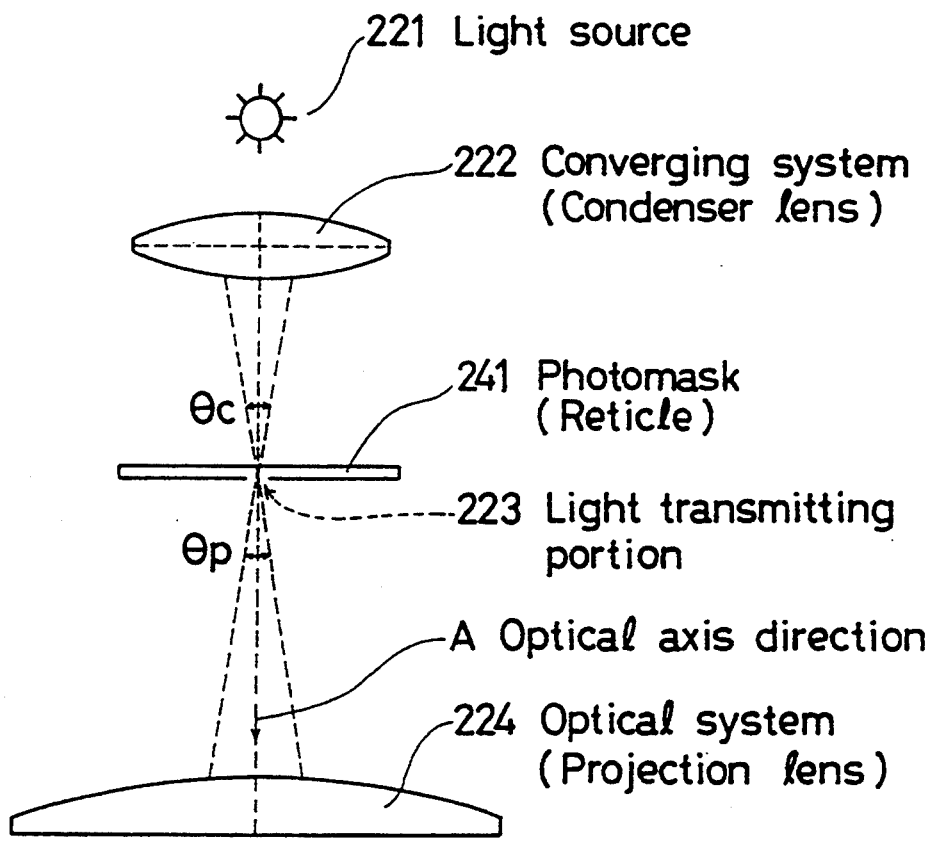
FIG. 24 is a view showing the whole arrangement of an optical system.
Figure 25:
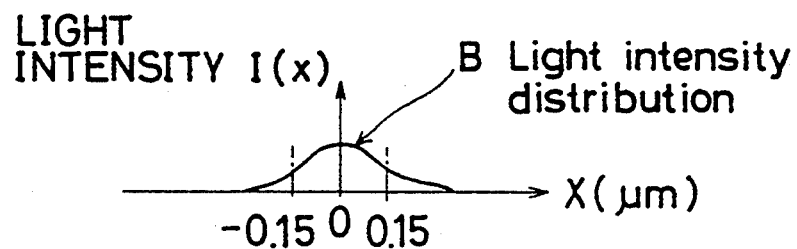
FIG. 25 is a view showing the distribution of a light intensity in a self-aligning type of phase shifter according to the prior art.

FIG. 24 conceptually shows an optical system in the vicinity of a reticle provided on a general projection exposure device. Light emitted from a light source 221 is gathered by a condenser lens 222 so as to form a focal plane in the vicinity of the lower end of a photomask (reticle) 241. At this time, there are determined by the optical system of the exposure device an estimated angle $\theta c$ on the condenser lens 222 side and an estimated angle $\theta p$ on the projection lens 224 side based on a focal position. An effective light intensity necessary for the optical system has an upper limit. FIG. 23 conceptually shows light transmitted through the reticle 241. In the case where a conventional reticle is used, vertical incident components 211 can mostly be transmitted through a transmitting portion 223. In the case where of a reticle having a convex portion 212 provided on the center of the transmitting portion 223 is used, oblique incident components 213 having an estimated solid angle Φ (a solid angle based on the width Δ of the transmitting portion 223) corresponding to the curvature C (or partial curvature Cp) can be utilized for the projected images of the light. When the pattern size of the reticle is reduced, the above-mentioned effects further become marked. As compared with the prior art, there will be described with reference to FIGS. 13, 14, 15, and 25 to 29 a process in which the vertical and oblique incident components are incident on a mask through the condenser lens and are then projected from the projection lens onto a wafer through the convex portion.

FIGS. 25 to 29 show the case where a self-aligning type of phase shifter 200 is used according to the prior art.

Figure 29:
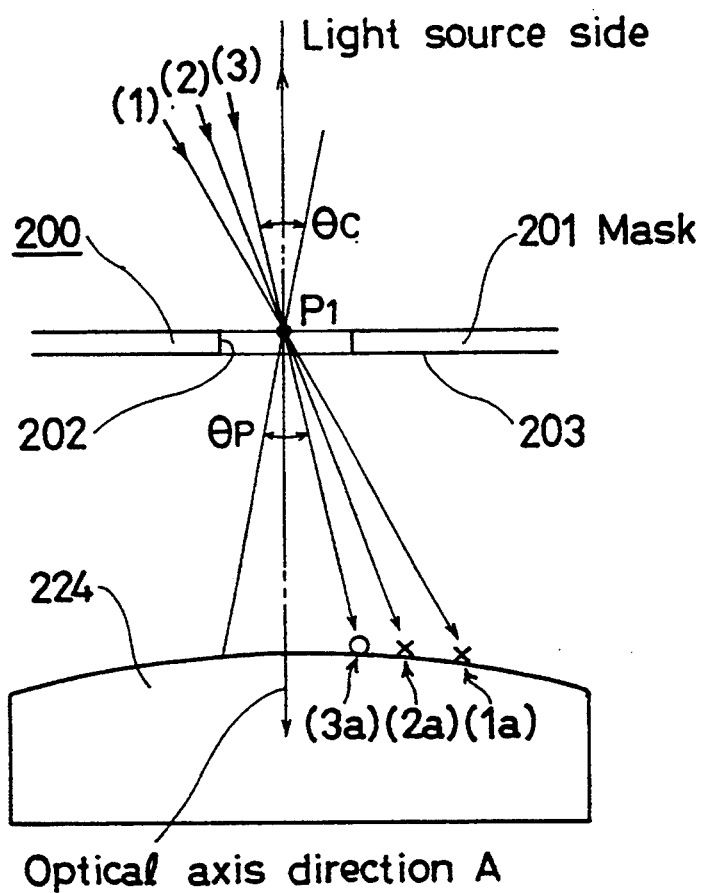
FIG. 29 is a view showing the propagation process of the oblique incident components of light according to the prior art.
Figure 30:
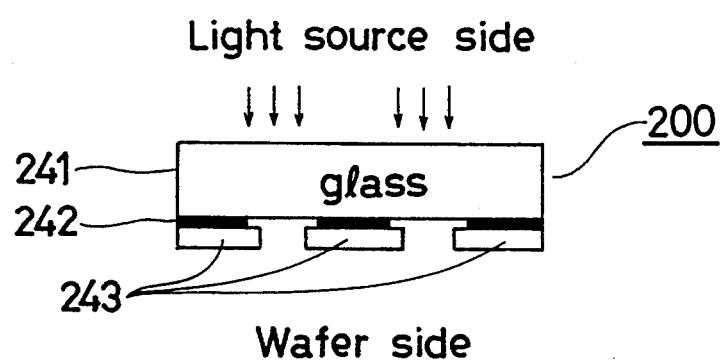
FIG. 30 is a view showing the structure of a self-aligning type phase of shifting reticle according to the prior art.
Figure 31:
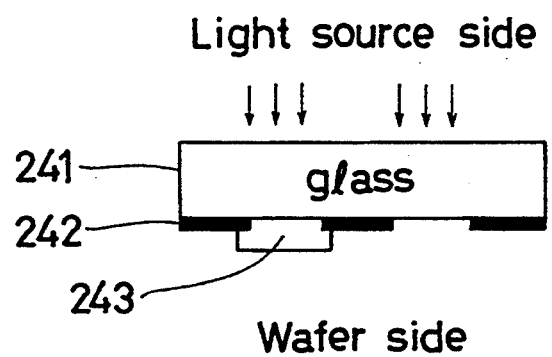
FIG. 31 is a view showing the structure of a Leverson type of phase shifting reticle.

As shown in FIG. 29, in the case where the oblique incident components (1), (2) and (3) of convergent light incident on a mask 201 have greater angles than the estimated angle θc, transmitted light components, which are to be projected as transmitted light onto a projection lens 224 and correspond to the incident components (1), (2) and (3), are projected into positions (1a), (2a) and (3a). While the components (1), (2) and (3) pass through a central position (represented by a point P1) on the aperture 202 of a transmitting portion, only the component (3) contributes to the image-formation on the point P1. The reference numeral 203 denotes a Cr plane.

Figure 14:
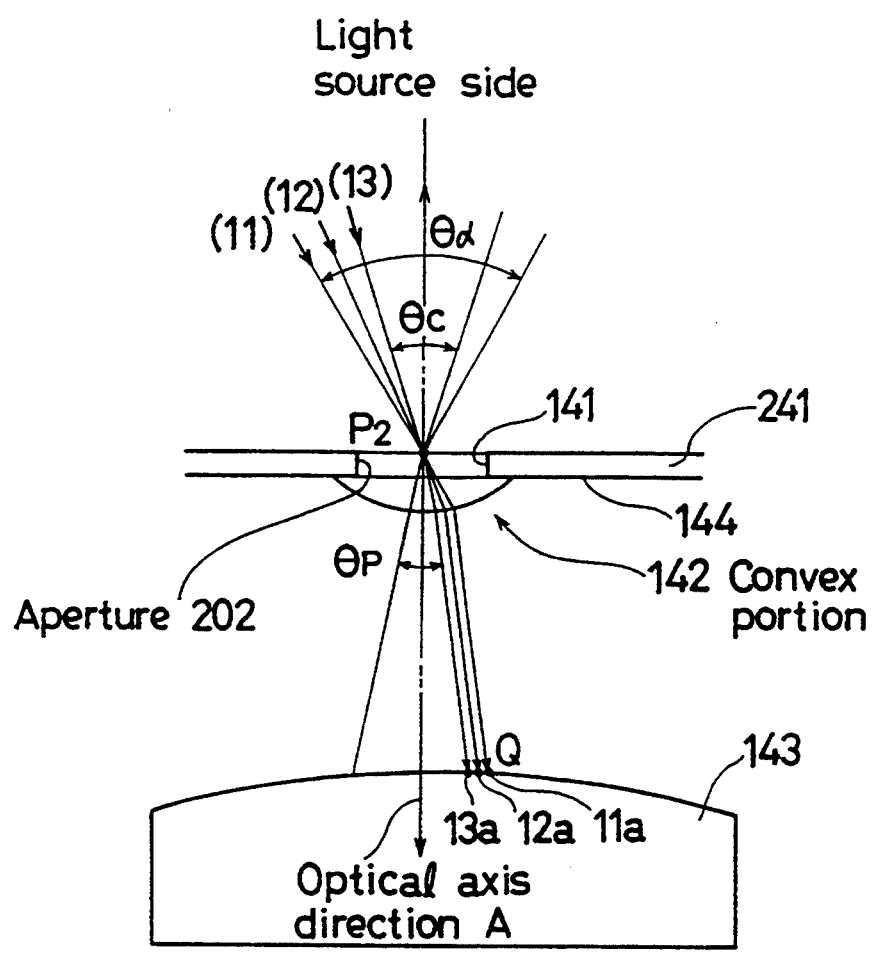
FIG. 14 is a view showing the propagation process of the oblique incident components of the transmitted light according to the embodiments of present invention.

According to an embodiment of the present invention, a convex portion 142 is provided to cover the aperture 141 of a transmitting portion as shown in FIG. 14. Consequently, it is seen that all the oblique incident components (11), (12) and (13) of convergent light passing through the central position (represented by a point P2) on the aperture 141 are projected into the positions (11a), (12a) and (13a) on the imaging plane of a projection lens 143 and contribute to the image-formation on the point P2. The reference numeral 144 denotes a Cr plane.

Figure 13:
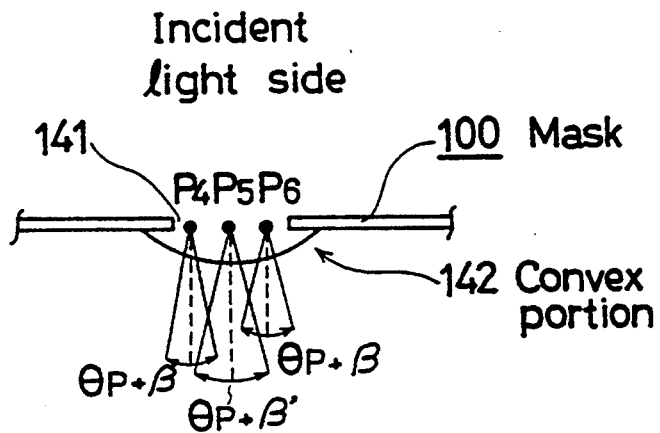
FIG. 13 is a view showing estimated angles $\theta p$, $\theta p + \beta$, and $\theta p + \beta'$ seen from the projection lens side.

The foregoing characteristics depend on the refractive effects of the convex portion 142. Referring to a self-aligning type of phase shifting reticle 200 (see FIGS. 25 to 27 and 30) according to the prior art, light passes through points P1, P2 and P3 in a mask 201 and is then emitted as transmitted light having an estimated angle θp (see FIG. 28). According to an embodiment of the present invention, the convex portion 142 is provided. As shown in FIG. 13, light passing through points P4, P5 and P6 on the aperture 141 of a mask 100 is emitted from the convex portion 142 at estimated angles θp+β (β>0) and θp+β' (β'>0). The components which contribute to the image formation on the points P4, P5 and P6 have greater angles by the angles β and β' as compared with the points P1, P2 and P3 shown in FIG. 28.

Figure 9:
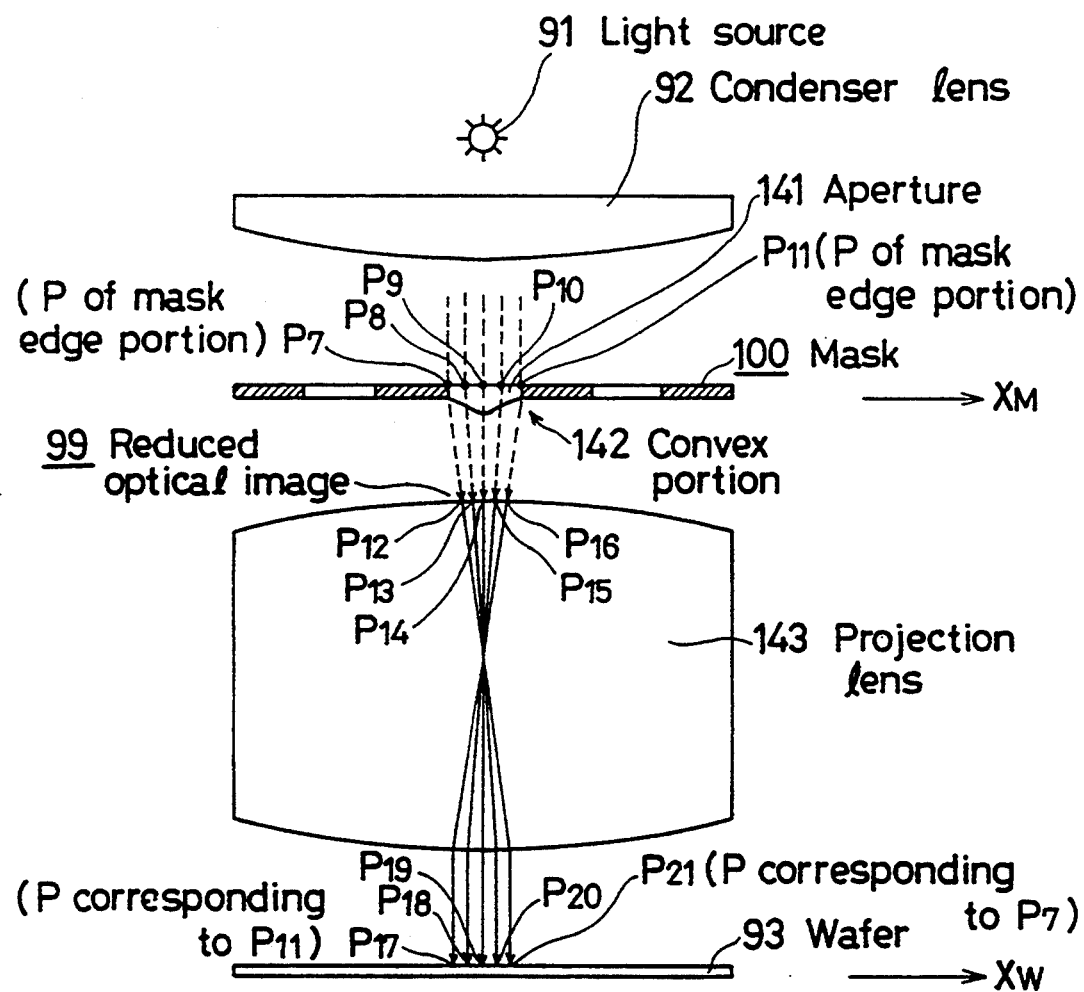
FIG. 9 is a view showing the propagation process of the vertical incident components of transmitted light according to the embodiments of the present invention.

There will be described the vertical incident components of convergent light. In the case where the mask 100 for an embodiment of the present invention is used as shown in FIG. 9, the vertical incident components of light emitted from a light source 91 and converged through a projection lens 92 are incident on the convex portion 142 formed on the aperture 141 of the mask 100. Then, the vertical incident components are emitted as transmitted light by refractive effects and are finally projected onto a wafer 93 through a projection lens 143.

In this case, the vertical incident components passing through points P7, P8, P9, P10 and P11 on the aperture 141 are first projected onto points P12, P13, P14, P15 and P16 on the projection lens 143 so as to become reduced optical images 99, and are then projected onto points P17, P18, P19, P20 and P21 on the wafer 93. The points P7 and P11 are positioned in edge portions on the mask 100. The points P7 and P11 correspond to points P21 and P17 which are positioned in edge portions on the wafer 93, respectively.

Thus, the vertical incident components are projected onto the wafer 93. The vertical incident components thus projected overlap with the oblique incident components projected onto the wafer 93 as shown in FIG. 14. Consequently, there is determined a relative light intensity I(X) on the wafer as an imaging plane. As a result, the relative light intensity I(X) can further be improved.

Figure 10:
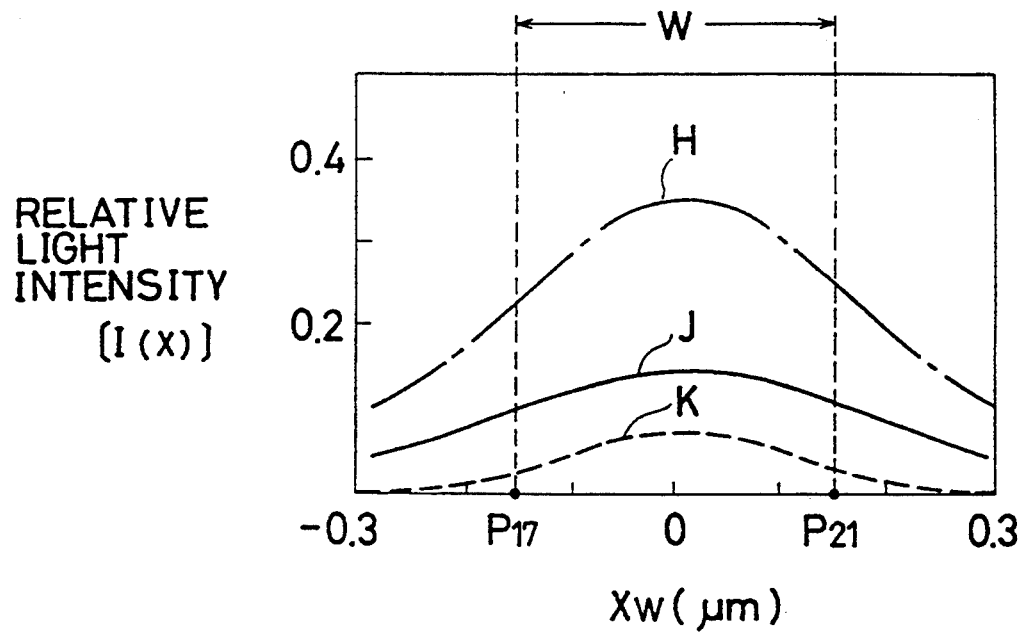
FIG. 10 is a view showing the distribution of relative light intensities obtained by simulations according to the first embodiment, an example in which a conventional phase shifter (photomask) is not used, and the prior art.

As shown in FIG. 9, a light intensity contrast on the imaging plane of the wafer is defined by a gradient (dI(X)/dXw) on the points P21 and P17 in the edge portions of the wafer 93 (Xw is equal to X). Taking the point P17 in the wafer edge portion as an example in FIG. 9, the coordinate position Xw of the light intensity contrast is defined by a gradient (dI(X)/dXw) on the point P17 as shown in FIG. 10. Taking the point P21 in the wafer edge portion as an example, the coordinate position Xw is defined by a gradient on the point P21. In FIG. 10, the reference designation H denotes the curve of a relative light intensity I(X) according to an embodiment of the present invention. The reference designations J and K denote the curves of a relative light intensity I(X) according to the prior art. As seen from FIG. 10, the gradient of the curve H in the wafer edge portion according to an embodiment of the present invention is greater than those of the curves J and K. Accordingly, the light intensity contrast can further be increased. Consequently, good patterning can be performed.

Figure 8:
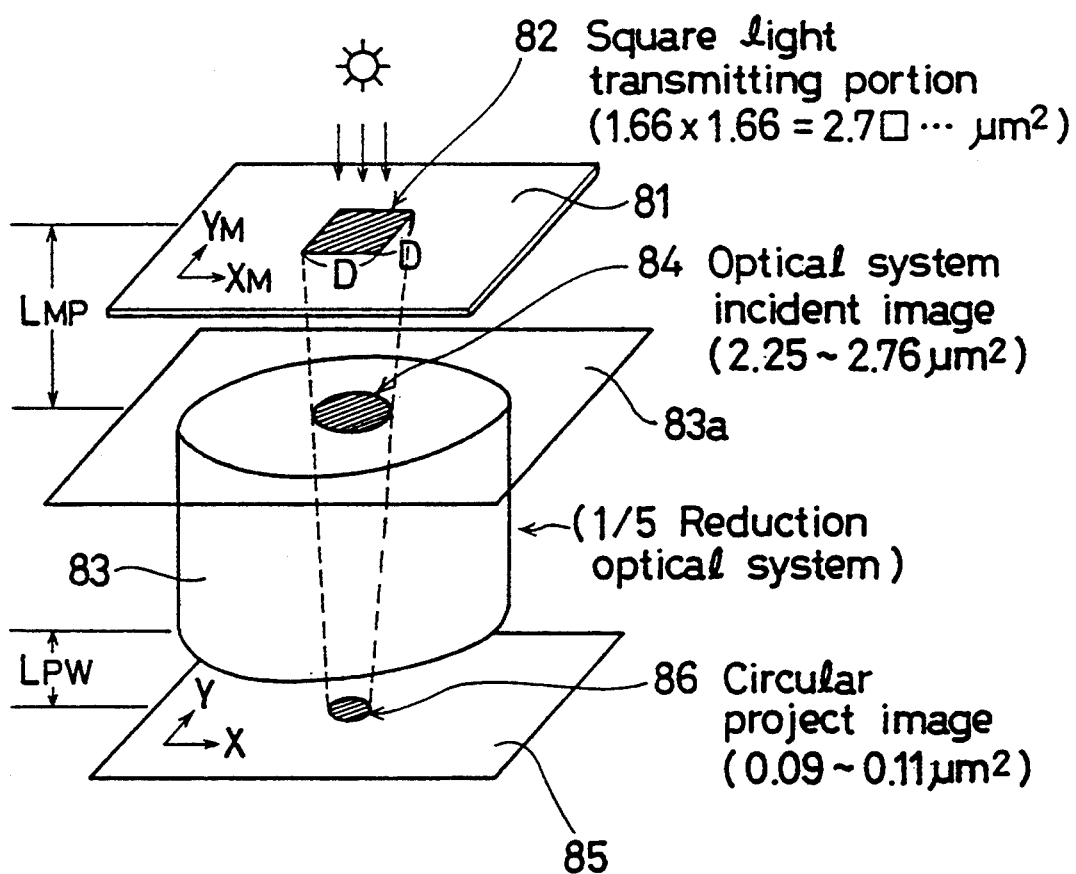
FIG. 8 is a view showing the area ratio of transmitted images according to the first embodiment of the present invention.

FIG. 8 shows the approximate value of the area of a transmitted image in the case where an embodiment of the present invention is applied to a step of forming a contact hole having a diameter of 0.3 μm on a wafer. The transmitted image on an optical system incident plane is an image which is projected onto a plane perpendicular to an optical axis (a light propagation direction).

In FIG. 8, a light transmitting portion 82 is formed on a mask 81. The light transmitting portion 82 covers a square aperture having a side of 0.3 μm, and is a square having a side D. By way of example, the light transmitting portion 82 has a side D of 1.66 μm and an area S1 of $1.66 \times 1.66 = 2.7\square$ μm². The top plane 83a of an optical system 83 is provided apart from the mask 81 at an interval $L_{MP}$ of about 5 cm. An image 84 projected and incident onto the top plane 83a has a size of 2.25 to 2.76 μm², for example. An imaging plane 85 on a wafer is provided apart from the optical system 83 at an interval $L_{PW}$ of about 1 cm. An image 86 projected onto the imaging plane 85 has a size of 0.09 to 0.11 μm²A .1/5reduction optical system is used for the optical system 83.

From the foregoing, it is seen that the light intensity contrast is improved.

Figure 11:
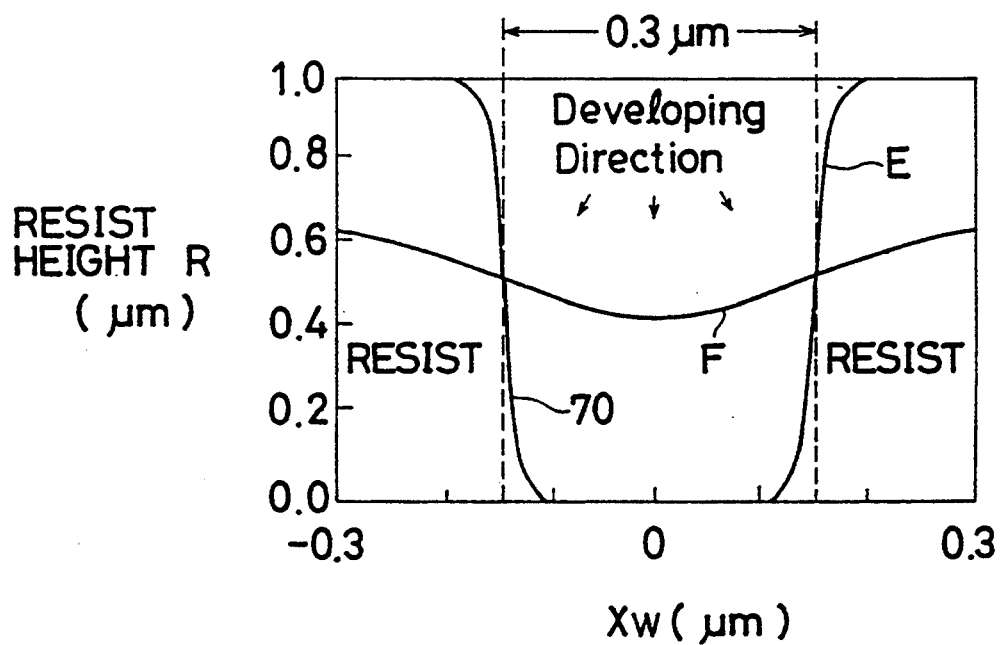
FIG. 11 is a characteristic chart showing the state in which a contact hole is opened after development according to the first embodiment and the prior art.
Figure 12:
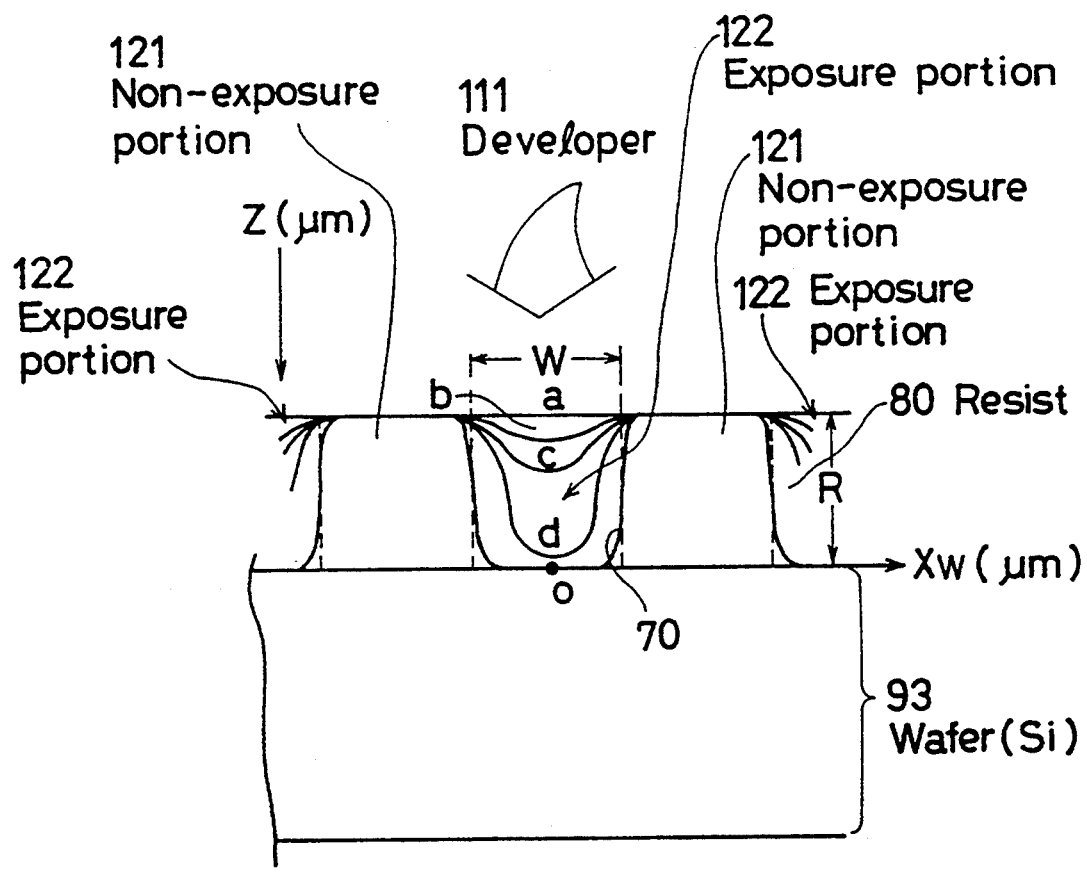
FIG. 12 is a view showing the change of time in the case of development according to the first embodiment.
Figure 15:
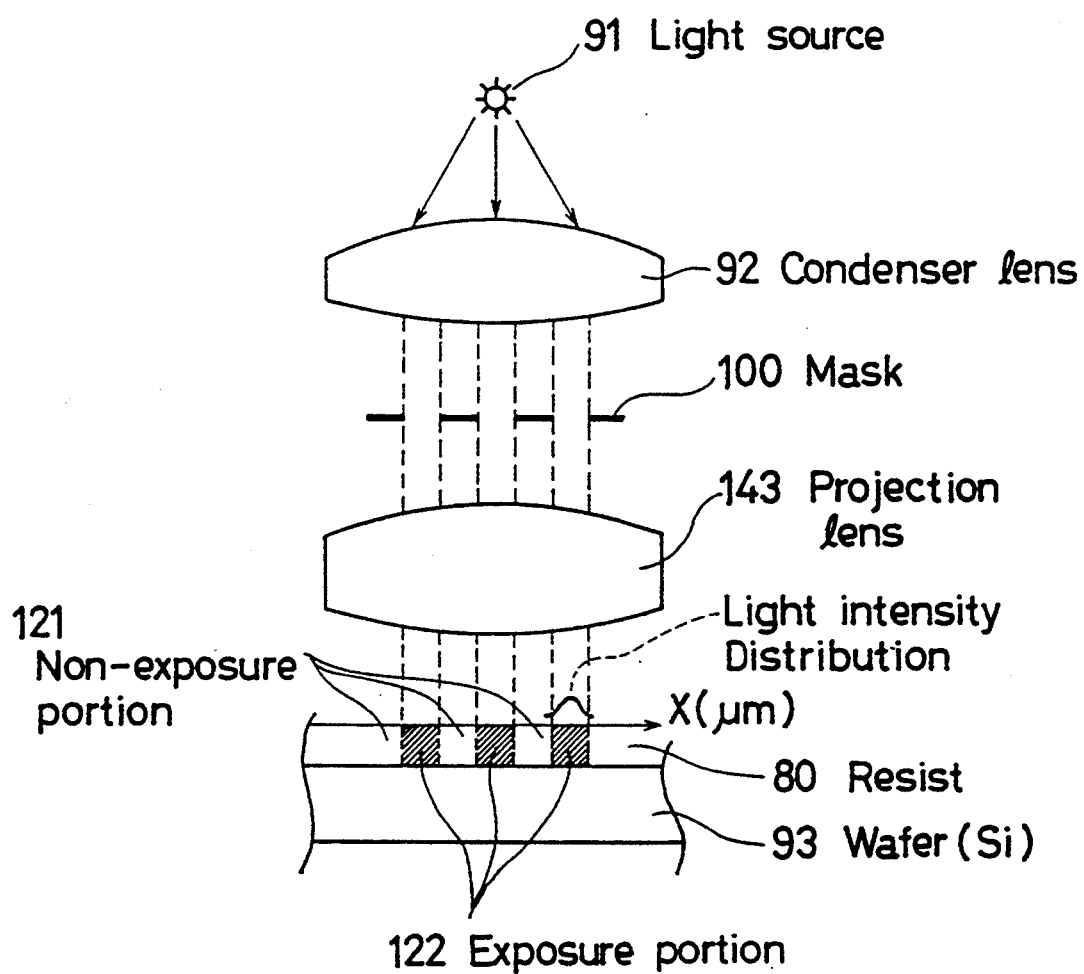
FIG. 15 is a view for explaining exposure according to the embodiments of the present invention.
Figure 16:
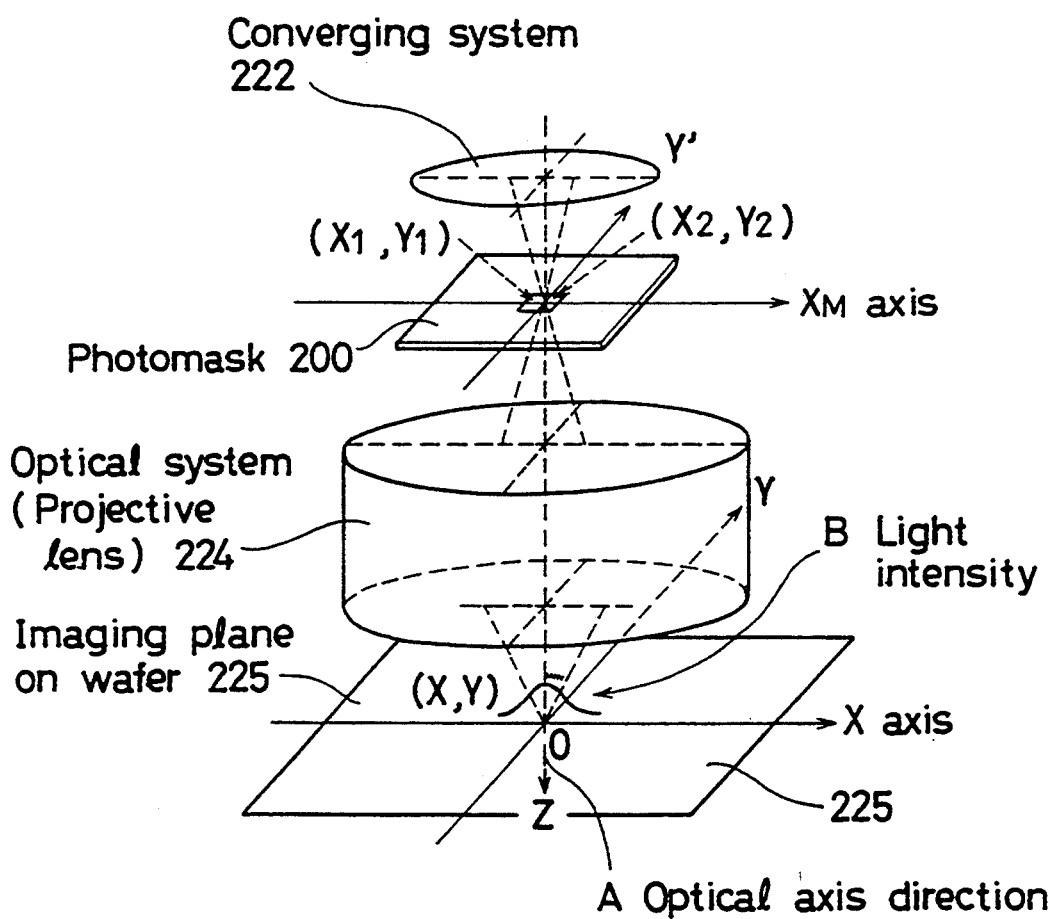
FIG. 16 is a view showing the whole mechanism of an optical system according to the embodiments of the present invention and the prior art.
Figure 26:
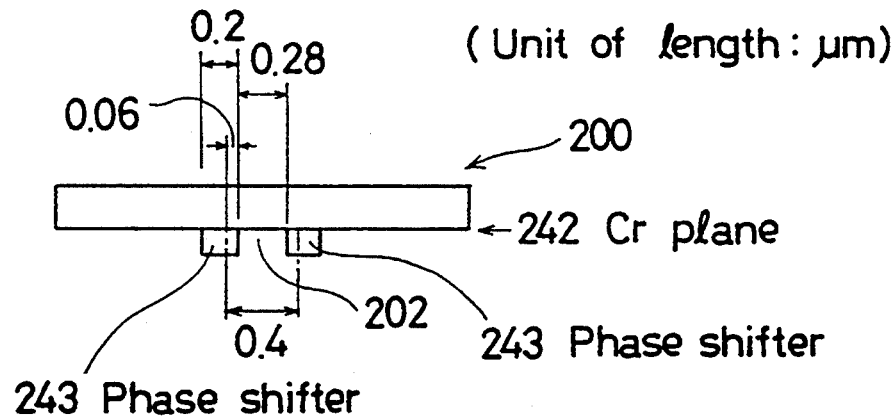
FIG. 26 is a view showing the structure of a main part according to the prior art.
Figure 27:
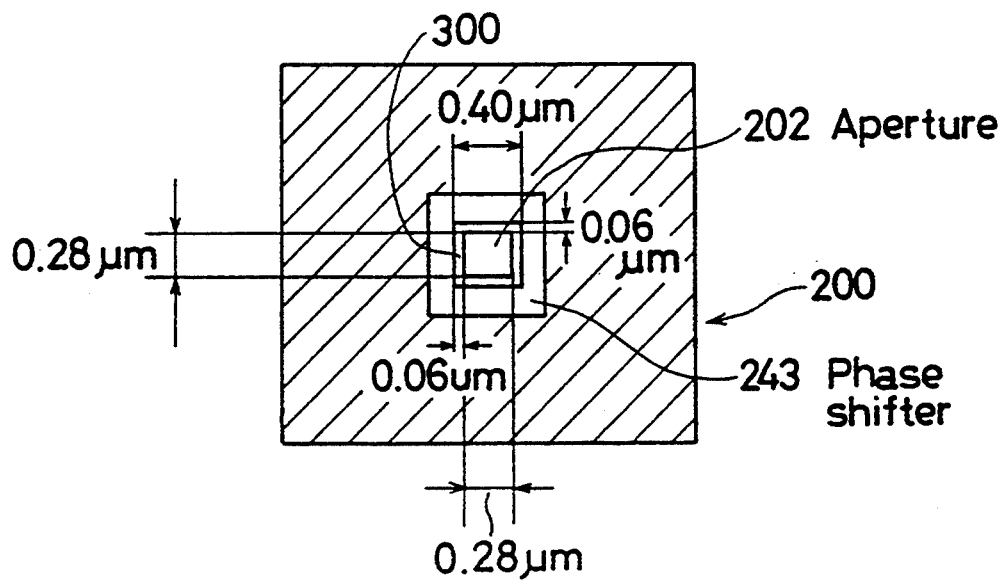
FIG. 27 is a view showing a structure according to the prior art.
Figure 28:
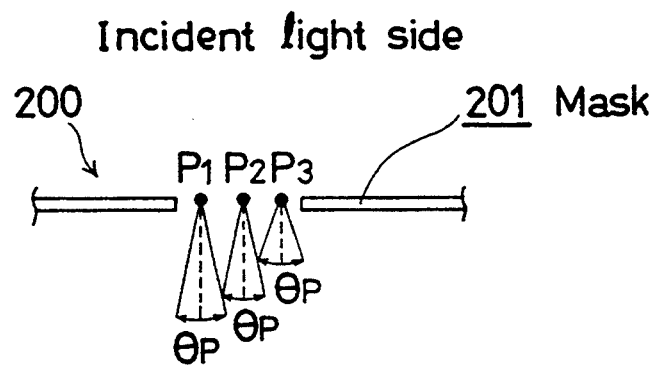
FIG. 28 is a view showing an estimated angle $\theta p$ seen from the projection lens side according to the prior art.

In FIG. 10, there are compared the relative light intensities I(X) of a phase shifter (photomask) having the convex portion (shown by the curve H), a conventional mask having no phase shifter (shown by the curve J) and a conventional self-aligning type of phase shifter (shown by the curve K, see FIGS. 26 and 27). FIG. 10 shows data obtained by setting the thickness R of a resist film 80 on a wafer (Si substrate) 93 to about 1 μm and a pattern width W to about 0.30 μm as shown in FIG. 12. In FIG. 10, an axis of abscissas Xw (μm) is the lateral coordinate of the resist film 80 shown in FIG. 12. A center O is provided in the middle point of the pattern width W (a position W/2). FIG. 11 shows the comparison of the variation of a resist height R for performing development by a developer 111 so as to form a contact hole 70 with that of the prior art (shown by a curve F). According to an embodiment of the present embodiment (shown by a curve E), it is seen that the contact hole 70 having a width of 0.3 μm is formed. According to the prior art, it is seen that the resist film is removed at a height of about 0.5 μm so that the contact hole is not formed. FIG. 15 specifically shows the state at the time of exposure. FIG. 12 specifically shows the state at the time of development. In FIG. 12, the reference numerals 121 and 122 denote a non-exposure portion and an exposure portion, respectively. It is seen that the surface form of the resist film 80 is varied in the order of a, b, c, d and e with the passage of developing time.

Figure 1:
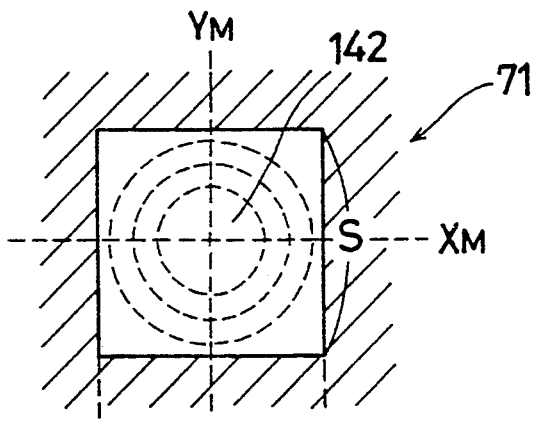
FIG. 1 is a view showing a structure according to a first embodiment of the present invention.
Figure 2:
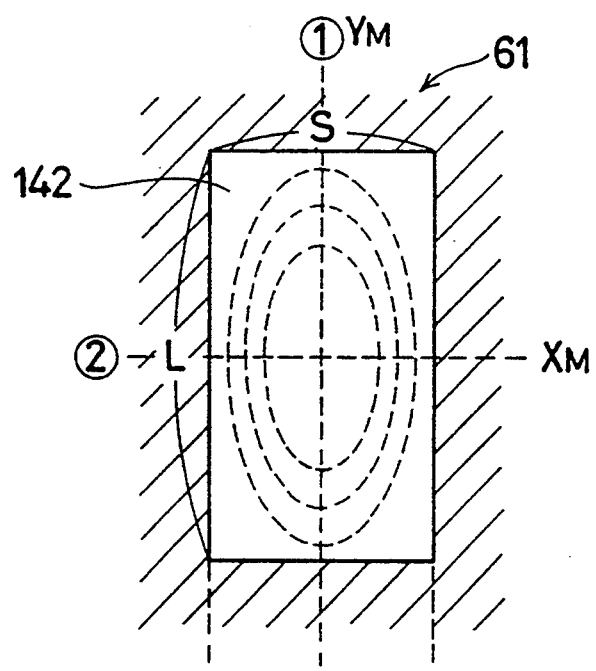
FIG. 2 is a view showing a structure according to a second embodiment of the present invention.
Figure 5:
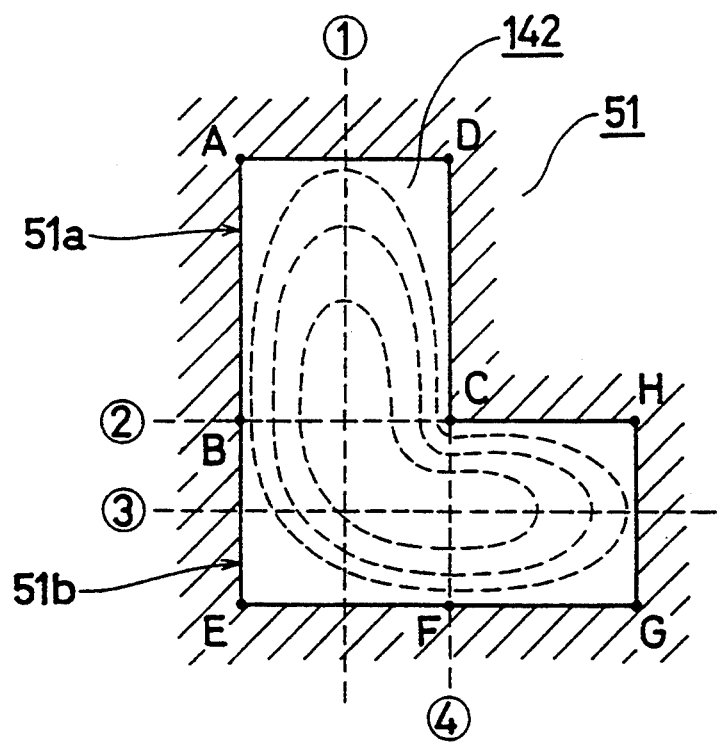
FIG. 5 is a view showing a structure according to a fourth embodiment of the present invention.

According to an embodiment of the present invention, examples of a convex portion are a square pattern 71 shown in FIG. 1, a rectangular pattern 61 shown in FIG. 2, and a pattern 51 obtained by combining a square and a rectangle as shown in FIG. 5.

Figure 4:
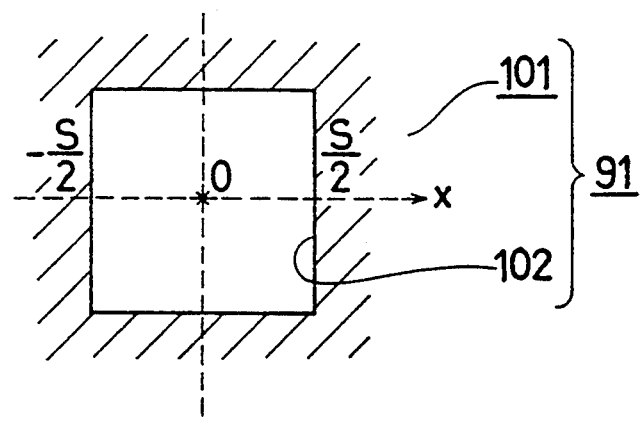
FIG. 4 is a view showing a structure according to the third embodiment of the present invention.
Figure 21:
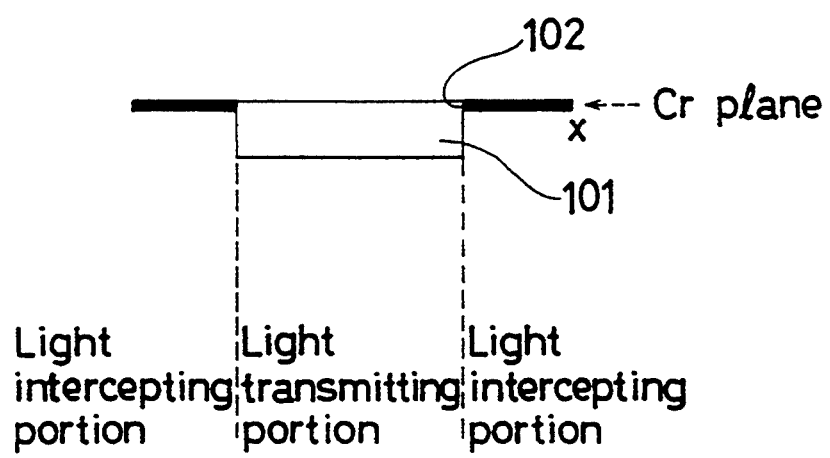
FIG. 21 is a view showing the structure of a main part according to the third embodiment of the present invention.

In addition, an example of a distributed refractive index lens 101 is shown in FIGS. 4 and 21.

Figure 3:
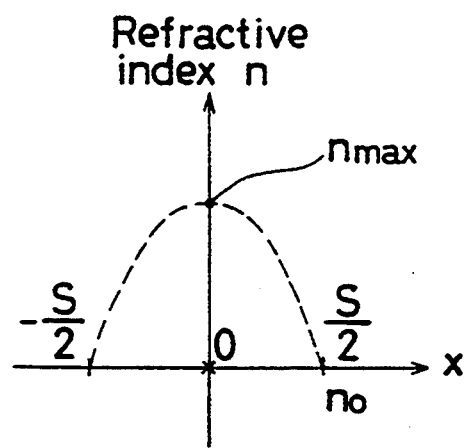
FIG. 3 is a characteristic chart showing the distribution of a refractive index according to a third embodiment of the present invention.

In FIG. 3, a refractive index distribution conceptually shows the state of the distribution of a refractive index of which a maximum point ($n_{max}$) is taken as a center. The minimum point ($n_0$) of the refractive index corresponds to a lens end.

Figure 6:
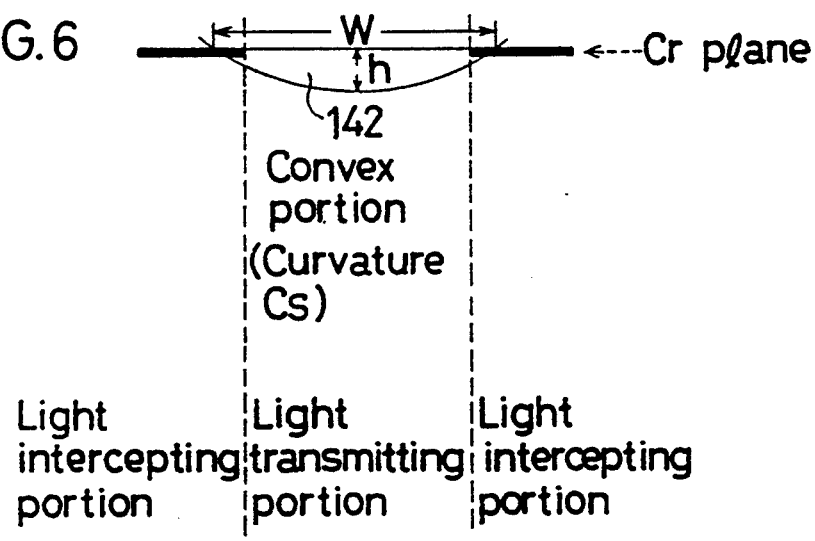
FIG. 6 is a view showing the structure of a main part according to the first embodiment of the present invention.
Figure 7:
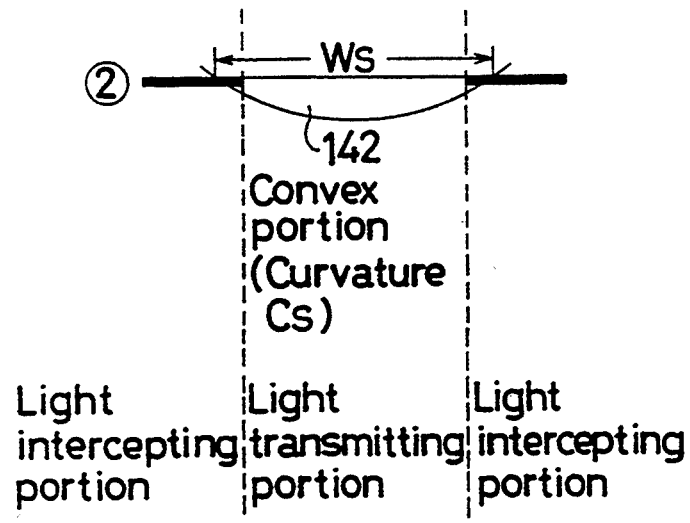
FIG. 7 is a view showing the structure of a main part according to the second embodiment of the present invention.
Figure 22:
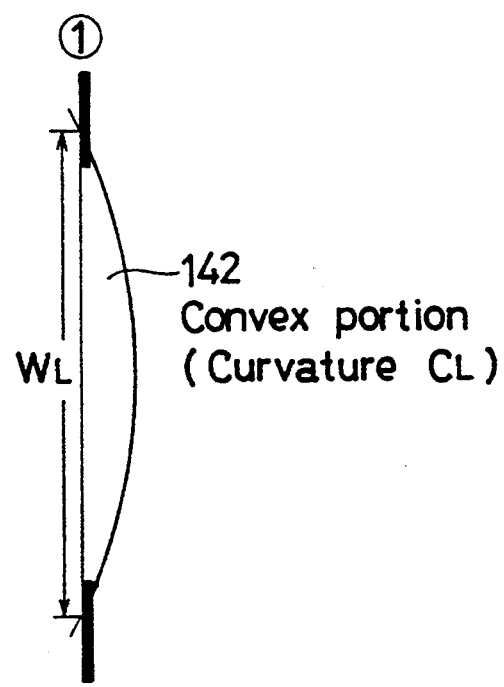
FIG. 22 is a view showing the structure of a main part according to the second embodiment of the present invention.

According to an embodiment of the present invention, the curvature or a plurality of partial curvatures of a convex portion 142 is(are) basically defined by a sectional shape in a central position. As shown in FIG. 1, the convex portion 142 having a square pattern is almost symmetrical with respect to a center. The sectional shape of the convex portion 142 taken along a dotted line ($X_M$ line) has a curvature Cs and a width W (see FIG. 6). These values are varied. As shown in FIG. 2, the convex portion 142 having a rectangular pattern is almost symmetrical with respect to central axes 1 and 2 (dotted lines). A central section on the long side (L) has a curvature $C_L$ and a width $W_L$ (see FIG. 22). A central section on the short side (S) has a curvature $C_S$ and a width $W_S$ (see FIG. 7). These values are varied.

FIG. 5 shows a photomask pattern 51 obtained by combining a rectangle ABCD, and squares BEFC and FGHC. In FIG. 5, the basic symmetry axes of the pattern 51 include an axis 1 of a partial pattern 51a defined by a rectangle AEFD and an axis 3 of a partial pattern 51b defined by a rectangle EGHB.

Figure 17:
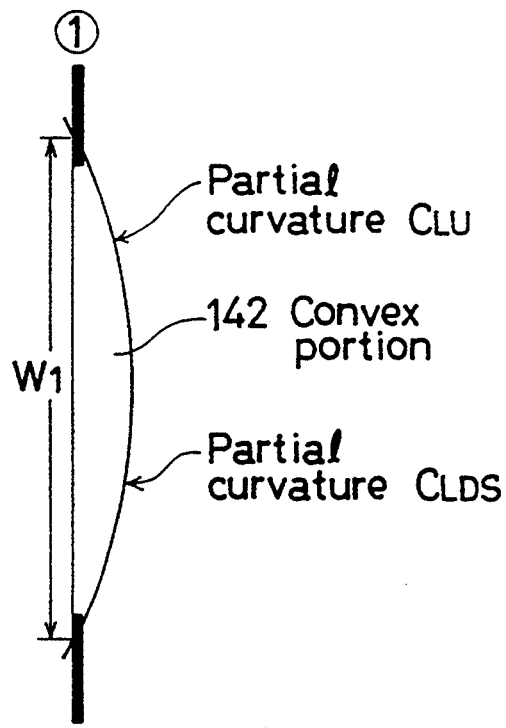
FIG. 17 is a view showing the structure of a main part according to the fourth embodiment of the present invention.

In this case, the convex portion 142 is almost symmetrical with respect to the axes 1 and 3. More specifically, the sectional shape of the convex portion 142 taken along the axis 1 has a width W1 and partial curvatures $C_{LU}$ and $C_{LDS}$ as shown in FIG. 17. The width W1 is almost equal to a line segment AE.

Figure 18:
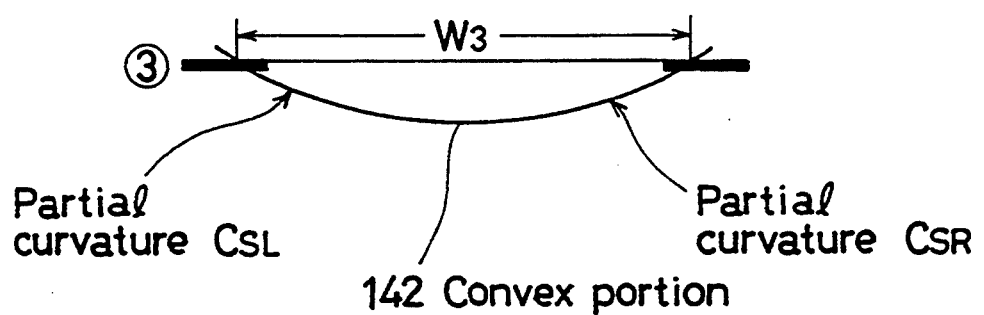
FIG. 18 s a view showing the structure of the main part according to the fourth embodiment of the present invention.

The sectional shape of the convex portion 142 taken along the axis 3 has a width W3 and partial curvatures $C_{SL}$ and $C_{SR}$ as shown in FIG. 18. The width W3 is almost equal to a line segment EG.

Figure 19:
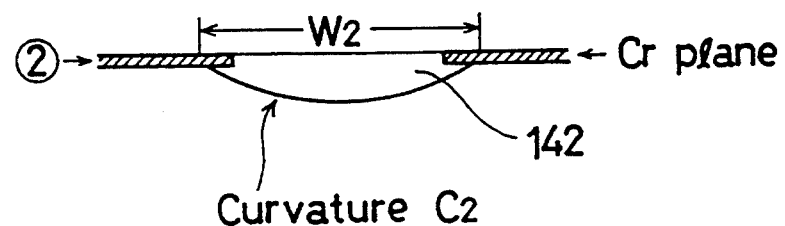
FIG. 19 s a view showing the structure of the main part according to the fourth embodiment of the present invention.

The sectional shape of the convex portion 142 taken along the axis 2 as a junction of the rectangle ABCD and the square BEFC forming the rectangle AEFD has a width W2 and a curvature C2 as shown in FIG. 19. The width W2 is almost equal to a line segment BC.

Figure 20:
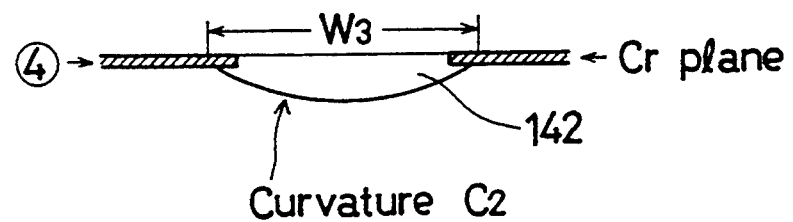
FIG. 20 is a view showing the structure of the main part according to the fourth embodiment of the present invention.

The sectional shape of the convex portion 142 taken along an axis 4 as a junction of the rectangle AEFD and the square FGHC has a width W3 and a curvature C3 as shown in FIG. 20. The width W3 is almost equal to a line segment HG. When the values of W2, W3, C2 and C3 are varied, there can be obtained a combination type of photomask having a desired convex portion 142.

Embodiments of the present invention will be described with reference to FIGS. 1, 2, 5 and 4 which are the contour maps and the sectional view of a reticle to which the present embodiments are applied. FIG. 1 shows a square pattern (contact pattern) 71 having a side according to a first embodiment of the present invention. A convex portion is formed on a reticle transmitting portion by a transparent or translucent material ($SiO_2$, SOG or the like). The convex portion is defined by a curvature C or partial curvature Cp within the range of manufacturing errors. In FIG. 1, the convex portion is defined by the entire curvature C, for example.

FIG. 2 shows an example of a simple rectangular pattern 61 according to a second embodiment of the present invention. If a length in a long side direction is represented by L and a length in a short side direction is represented by S, the central section of the convex portion 142 is defined by a sectional shape on the long side taken along an axis 1 (see FIG. 22) and a sectional shape on the short side taken along an axis 2 (see FIG. 7). More specifically, the sectional shapes on the long and short sides are defined by curvatures $C_L$ and $C_S$, respectively.

FIG. 5 shows a pattern 51 obtained by combining two rectangular patterns according to a fourth embodiment of the present invention. The sectional shapes of the convex portion 142 taken along axes 1, 2 and 4 are shown in FIGS. 17, 19 and 20, respectively. Each sectional shape is defined by the curvature C or partial curvature Cp. By way of example, the sectional shapes of the convex portion 142 taken along the axes 1 and 3 shown in FIG. 5 are defined by the partial curvatures $C_{LU}$ and $C_{LDS}$ and the partial curvatures $C_{SL}$ and $C_{SR}$, respectively. FIGS. 19 and 20 show the sectional shapes of the convex portion 142 taken along the axes 2 and 4 shown in FIG. 5, respectively.

FIGS. 3, 4 and 21 show the state of a pattern 91 according to a third embodiment of the present invention, in which a distributed refractive lens (of a plane type) 101 having the same optical effects as in the convex portion is provided on a light transmitting portion 102. The distributed refractive lens 101 serves to refract the transmitted light with a continuous refractive index distribution ($n_0$ to $n_{max}$) in similar manner to the convex portion.

FIGS. 10 and 11 show the simulated results of a light intensity distribution on an imaging plane, which are obtained by using a photomask having the convex portion 142. The reference designation H denotes the results obtained by using the photomask having the convex portion 142 according to embodiments of the present invention. The reference designation J denotes the results obtained by using a photomask having no phase shifter. The reference designation K denotes the results obtained by using a self-aligning type of phase shifter according to the prior art.

As the conditions of exposure, a wavelength λ is set to 365 nm, a numerical aperture NA is set to 0.45, and a coherent factor σ is set to 0.50 in order to form a contact hole having a diameter of 0.30 μm (an actual diameter is 1.5 μm because a 1/5reduction optical system is used). A curve H denotes a relative light intensity I(X) obtained in the case where the convex portion 142 (see FIG. 1) is provided on a square mask having a size of 0.04 μm. A curve J denotes a relative light intensity I(X) obtained by using a square mask which has a size of 0.30 μm and has no phase shifter. A curve K denotes a relative light intensity I(X) obtained by using a self-aligning type of mask in which a shifter width on the periphery of an aperture 202 is 0.06 μm (having a phase difference of π) and which has a square central light transmitting portion 300 having a side of 0.28 μm (having a phase difference of 0). As described above, a 1/5reduction optical system is used for the optical system.

As shown in FIGS. 10 and 11, the convex portion is formed on the center of the light transmitting portion of a fine exposure pattern, so that a light intensity on the imaging plane and a light intensity contrast on the resist plane of a wafer as a target position can be increased. Consequently, it is possible to enhance resolution in a lithography process. The light intensity and light intensity contrast are varied according to the curvature C or partial curvature Cp of the convex portion provided on the light transmitting portion. Their optimum values depend on the manufacturing environment and an exposure device to be used.

According to the embodiments of the present invention, the light intensity and light intensity contrast of the projected image can be enhanced by forming the convex portion on the light transmitting portion of the photomask. Consequently, the resolution in the lithography process can be improved. Thus, the fine patterns of an actual LSI, in particular, an isolated pattern, an aperiodic pattern and a plurality of combined patterns can effectively be transferred onto the wafer.

What is claimed is:

1. A photomask for receiving light for exposure emitted from a light source and for projecting the emitted light through a projection lens onto a resist film on a wafer so as to pattern the resist film, the photomask comprising:

a glass substrate including a plurality of light transmitting portions for receiving and transmitting the emitted light for exposure and a light interception portion;

a convex portion, made of a transparent or translucent material and formed protruding from a side of the glass substrate on which the wafer is provided, covering the light transmitting portions and a surrounding portion thereof, for utilizing refractive effects to gather vertical and oblique incident components of the emitted light for exposure emitted as transmitted light, for projection through a projection lens to form an image on the imaging plane of the wafer.

2. The photomask according to claim 1, wherein the convex portion comprises a curved surface defined by at least one of a single curvature and a plurality of partial curvatures.

3. The photomask according to claim 2, wherein said convex portion comprises a plurality of convex sections having curved surfaces of at least one of the same shape and shapes which are different from each other.

4. The photomask according to claim 1, wherein the vertical incident components and oblique incident components exist within a range of an estimated angle on a side of the glass substrate opposite the water, and oblique incident components which exist beyond a range of the estimated angle by the refractive effects of the incident light.

5. The photomask according to claim 1, wherein the plurality of light transmitting portions include at least one of a square pattern and a rectangular pattern.

6. A photomask for receiving light for exposure from a light source and projecting the emitted light onto a resist film on a wafer through an optical system so as to pattern the resist film, the photomask comprising:

a glass substrate including a plurality of light transmitting portions through which incident light is transmitted and a light intercepting portion; and a distributed refractive index lens, covering the light transmitting portions and a surrounding portion thereof, for utilizing refractive effects to gather vertical and oblique incident components of the received light and for transmitting the gathered light to a projection lens for projection to form an image on the imaging plane of the wafer.

7. A projection exposure mechanism comprising:

a converging system of gathering oblique and vertical light components for exposure from light emitted from a light source;

a photomask including a light transmitting portion and a light intercepting portion, the light transmitting portion and a surrounding portion thereof being covered by a convex portion, the convex portion utilizing refractive effects to gather incident light components and oblique components transmitted from the converging system and transmitting the gathered light which can form an image on the imaging plane of a wafer;

an optical system for receiving and projecting the transmitted light from the photomask onto the wafer; and a supporting portion for supporting the wafer such that a wafer imaging plane is provided in parallel with a plane perpendicular to the optical axis of the light transmitted from the light source through the optical system.

8. The photomask according to claim 6, wherein said distributed refractive index lens respectively extends to said light intercepting portion adjacent to said light transmitting portions to cover said light transmitting portions.

9. A projection exposure mechanism having a self-aligning type of phase shifter for transferring isolated fine patterns, aperiodic patterns and combined patterns onto an imaging plane, the projection exposure mechanism comprising:

a light source for emitting light having vertical and oblique incident components;

a photomask including, a plurality of light transmitting portions for receiving said vertical and oblique incident components of the light emitted by said light source, and a plurality of convex portions, covering said plurality of light transmitting portions and surrounding portions thereof on a surface of said photomask facing the imaging panel, for utilizing refractive effects to gather said vertical and oblique incident components and for transmitting the gathered light; and a projection lens for receiving the gathered light and for projecting the gathered light onto said imaging plane to thereby improve the intensity of the light on the imaging plane.

10. The projection exposure mechanism according to claim 9, wherein said plurality of convex portions each comprise a curved surface defined by at least one of a curvature and a plurality of partial curvatures.

11. The projection exposure mechanism according to claim 10, wherein said convex portions each comprise a plurality of convex sections having curved surfaces of the same shape, or at least two of the convex sections have curved surfaces of shapes which are different from each other.

12. The projection exposure mechanism according to claim 9, wherein said oblique incident components include components which exist within a range of an estimated angle on the surface of said photomask which faces the imaging plane and components which exist beyond a range of the estimated angle by the refractive effects of the light emitted by said light source.

13. The projection exposure mechanism according to claim 9, wherein said light transmitting portions include at least one of a square pattern and a rectangular pattern.

* * * * *